United States Patent
Mobin et al.

(10) Patent No.: US 9,651,614 B1
(45) Date of Patent: May 16, 2017

(54) SYSTEMS AND METHODS FOR SERDES PHYSICAL LAYER QUALIFICATION AND MITIGATION

(71) Applicant: Avago Technologies General IP (Singapore) Pte. Ltd., Singapore (SG)

(72) Inventors: Mohammad Mobin, Orefield, PA (US); John Jansen, Macungie, PA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/959,873

(22) Filed: Dec. 4, 2015

(51) Int. Cl.
*G01R 31/28* (2006.01)
*G01R 31/317* (2006.01)
*G01R 31/3177* (2006.01)
*G01R 31/3183* (2006.01)
*G01R 31/3187* (2006.01)
*G01R 31/3181* (2006.01)
*G01R 31/3185* (2006.01)

(52) U.S. Cl.
CPC ... *G01R 31/31703* (2013.01); *G01R 31/3177* (2013.01); *G01R 31/3181* (2013.01); *G01R 31/3187* (2013.01); *G01R 31/318314* (2013.01); *G01R 31/318552* (2013.01)

(58) Field of Classification Search
CPC .......... G01R 31/31703; G01R 31/3177; G01R 31/3181; G01R 31/318314; G01R 31/318552; G01R 31/3187
See application file for complete search history.

(56) References Cited

U.S. PATENT DOCUMENTS

| | | | |
|---|---|---|---|
| 7,526,033 B2 | 4/2009 | Sindalovsky et al. | |
| 8,037,377 B1 * | 10/2011 | Chia | G01R 31/31716 714/712 |
| 8,213,297 B2 * | 7/2012 | Bennah | H04L 49/40 370/217 |
| 8,972,806 B2 * | 3/2015 | Miller | G01R 31/3171 700/94 |
| 2006/0034358 A1 | 2/2006 | Okamura | |

OTHER PUBLICATIONS

Seat "Gearing Up Serdes for High-Speed Operation" Apr. 3, 2002 Retrieved from the Internet Oct. 2, 2015 http://www.eetimes.com/document.asp?doc_id=1205307.
Nelson "Serdes Devices Challenge ATE" EDN Network Aug. 1, 2002 retrieved from the Internet Dec. 8, 2015 http://www.edn.comidesign/test-and-measurement/4383588/Serdes-devices-challenge.

* cited by examiner

*Primary Examiner* — Christine Tu
(74) *Attorney, Agent, or Firm* — Sheridan Ross P.C.

(57) ABSTRACT

Embodiments are related to systems and methods for data processing, and more particularly to systems and methods for clock recovery in a data receiver.

20 Claims, 9 Drawing Sheets

SYSTEMS AND METHODS FOR SERDES PHYSICAL LAYER QUALIFICATION AND MITIGATION

FIELD OF THE INVENTION

Embodiments are related to systems and methods for circuit qualification, and more particularly to systems and methods for determining circuit operation and mitigating improper circuit operation.

BACKGROUND

A number of data transfer systems have been developed. Some transfer systems use one or more serial data transmission and reception circuits. In some cases the serial transmission and reception circuits do not operate properly resulting in the rejection of the circuit. Such rejection is wasteful.

Hence, for at least the aforementioned reasons, there exists a need in the art for advanced systems and methods for identifying and mitigating improper circuit operation.

SUMMARY

Embodiments are related to systems and methods for circuit qualification, and more particularly to systems and methods for determining circuit operation and mitigating improper circuit operation.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1A:
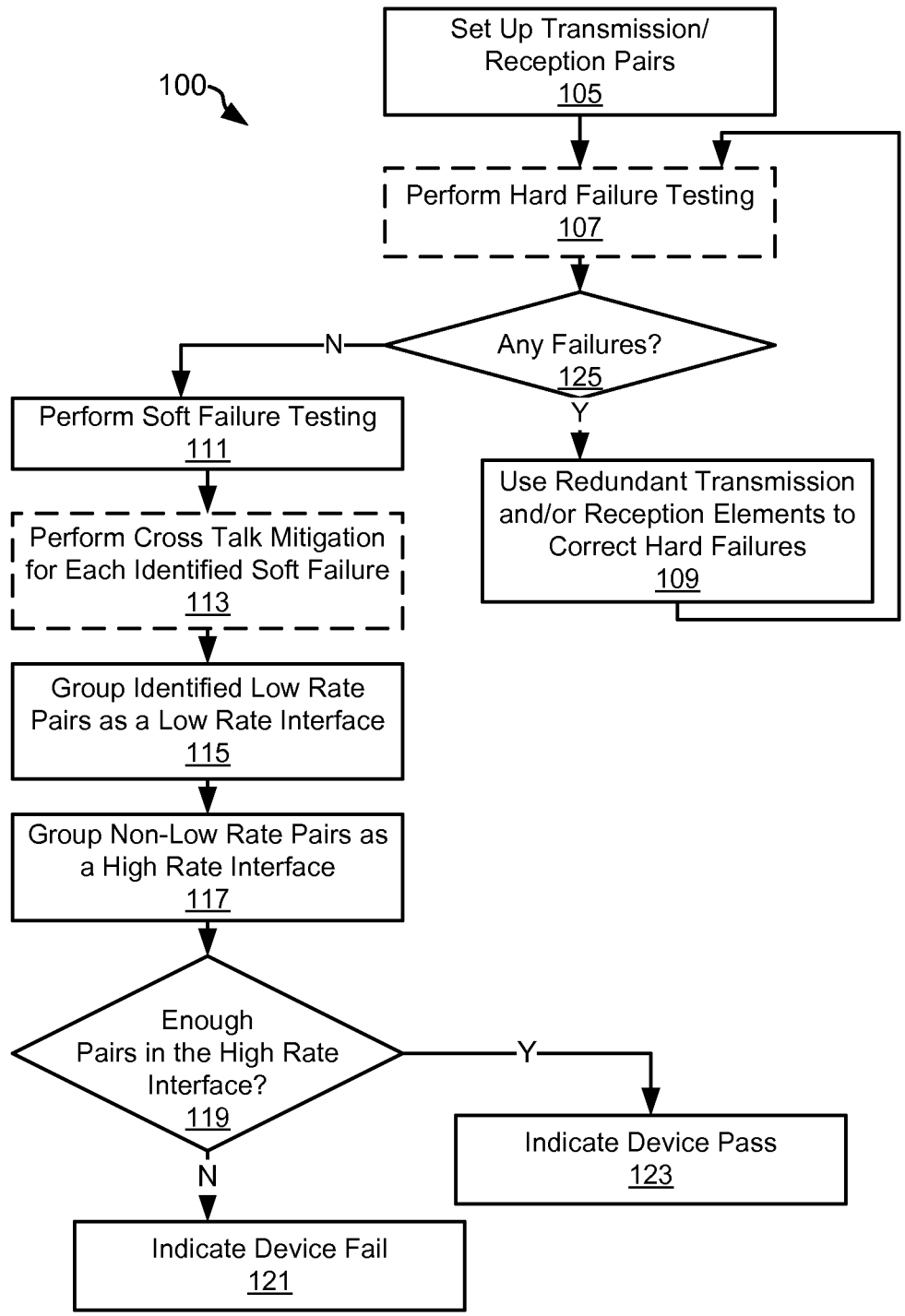
FIGS. 1a-1c are flow diagrams showing a method in accordance with various embodiments of the present invention for identifying and mitigating improper transmission operation.

Embodiments are related to systems and methods for circuit qualification, and more particularly to systems and methods for determining circuit operation and mitigating improper circuit operation.

Various embodiments of the present invention provide test systems that include a serial data transfer circuit, and an analysis control circuit. The analysis control circuit is configured to provide a command to a device under test that includes: at least a first transmission circuit, a second transmission circuit, a first reception circuit, a second reception circuit, and a cross bar switch electrically connected to each of the first transmission circuit, the second transmission circuit, the first reception circuit, and the second reception circuit. The command causes the cross bar switch to be programmed such that: the first transmission circuit is communicably coupled to the first reception circuit, and the second transmission circuit is communicably coupled to the second reception circuit. The analysis control circuit is further configured to: send a command to the serial data transfer circuit to pass a known pattern to the first reception circuit and the second reception circuit; receive loop back data from via the first transmission circuit and the second transmission circuit; detect a first hard fault in at least one of the first reception circuit or the first transmission circuit; send a command to the device under test to program the cross bar switch such that: the first transmission circuit is communicably coupled to the second reception circuit, and the second transmission circuit is communicably coupled to the first reception circuit; receive loop back data from via the first transmission circuit and the second transmission circuit; and detect a second hard fault, wherein the second hard fault isolates at least one of the first reception circuit or the first transmission circuit as the cause of the first hard fault.

In some instances of the aforementioned embodiments, the device under test further includes a third transmission circuit and a third reception circuit electrically coupled via the cross bar switch, and the analysis control circuit is further operable to: send a command to the serial data transfer circuit to pass the known pattern to the first reception circuit, the second reception circuit, and the third reception circuit; receive loop back data from via the first transmission circuit, the second transmission circuit, and the third transmission circuit; detect a first soft fault in at least one of the first reception circuit or the first transmission circuit; send a command to the serial data transfer circuit to pass the known pattern to the first reception circuit, the second reception circuit, but not the third reception circuit; and detect a second soft fault in at least one of the first reception circuit or the first transmission circuit. In such an instance, at least one of the third reception circuit or the third transmission circuit is identified as a cause of the first soft fault. In other instances of the aforementioned embodiments, the analysis control circuit is further operable to: send a command to the serial data transfer circuit to pass the known pattern to the first reception circuit, the second reception circuit, and the third reception circuit; receive loop back data from via the first transmission circuit, the second transmission circuit, and the third transmission circuit; detect a soft fault in at least one of the first reception circuit or the first transmission circuit; send a command to the serial data transfer circuit to pass the known pattern to the first reception circuit, the second reception circuit, but not the third reception circuit. Where no soft fault is detected the at least one of the first reception circuit or the first transmission circuit, at least one of the third reception circuit or the third transmission circuit is identified as having no causal relationship to the soft fault.

Various embodiments provide methods for device validation that include: providing a device under test, where the device under test includes at least a first transmission circuit, a second transmission circuit, a first reception circuit, a second reception circuit, and a cross bar switch electrically connected to each of the first transmission circuit, the second transmission circuit, the first reception circuit, and the second reception circuit; programming the cross bar switch such that: the first transmission circuit is communicably coupled to the first reception circuit, and the second transmission circuit is communicably coupled to the second reception circuit; performing a hard fault test by passing a known pattern to the first reception circuit and the second reception circuit, where a first hard fault is identified in at least one of the first reception circuit or the first transmission circuit; programming the cross bar switch such that: the first transmission circuit is communicably coupled to the second reception circuit, and the second transmission circuit is communicably coupled to the first reception circuit; and re-performing the hard fault test by passing the known pattern to the first reception circuit and the second reception circuit, where a second hard fault is identified which isolates at least one of the first reception circuit or the first transmission circuit as the cause of the first hard fault. In some cases, passing the known pattern to the first reception circuit and the second reception circuit is done at a low rate.

In some instances of the aforementioned embodiments, the second hard fault isolates the first reception circuit as the cause of the first hard fault, and the device under test further includes a redundant reception circuit. In such instances, the methods further include programming the cross bar switch such that the redundant reception circuit replaces the first reception circuit. In various instances of the aforementioned embodiments, the second hard fault isolates the first transmission circuit as the cause of the first hard fault, and the device under test further includes a redundant transmission circuit. In such instances, the methods further include programming the cross bar switch such that the redundant transmission circuit replaces the first transmission circuit.

In one or more instances of the aforementioned embodiments, the device under test further includes a third transmission circuit and a third reception circuit electrically coupled via the cross bar switch, and the methods further include: performing a soft fault test by passing the known pattern to the first reception circuit, the second reception circuit, and the third reception circuit, where a soft fault is identified in at least one of the first reception circuit or the first transmission circuit; and re-performing the soft fault test by passing the known pattern to the first reception circuit and the third reception circuit, but not to the second reception circuit. In some cases, passing the known pattern to the first reception circuit and the second reception circuit during the soft fault test is done at a high rate.

In various cases where the device under test further includes a redundant reception circuit and a redundant transmission circuit, and where re-performing the soft fault test results in identifying a soft fault in at least one of the first reception circuit or the first transmission circuit, the methods further include: programming the cross bar switch such that at least one of the redundant reception circuit or the redundant transmission circuit replaces a corresponding one of the first reception circuit or the first redundant transmission circuit. In some cases where the device under test further includes a redundant reception circuit and a redundant transmission circuit, and where re-performing the soft fault test does not result in identifying a soft fault in at least one of the first reception circuit or the first transmission circuit, the methods further include programming the cross bar switch such that a corresponding one of the redundant reception circuit or the redundant transmission circuit replaces the aggressor circuit. In one or more cases where re-performing the soft fault test results in identifying a soft fault in at least one of the first reception circuit or the first transmission circuit, the methods further include grouping at least one of the first reception circuit or the first redundant transmission circuit in a low rate interface. In particular cases where re-performing the soft fault test results in elimination of the soft fault in the at least one of the first reception circuit or the first transmission circuit, the methods further include grouping the aggressor circuit in a low rate interface.

Figure 2A:
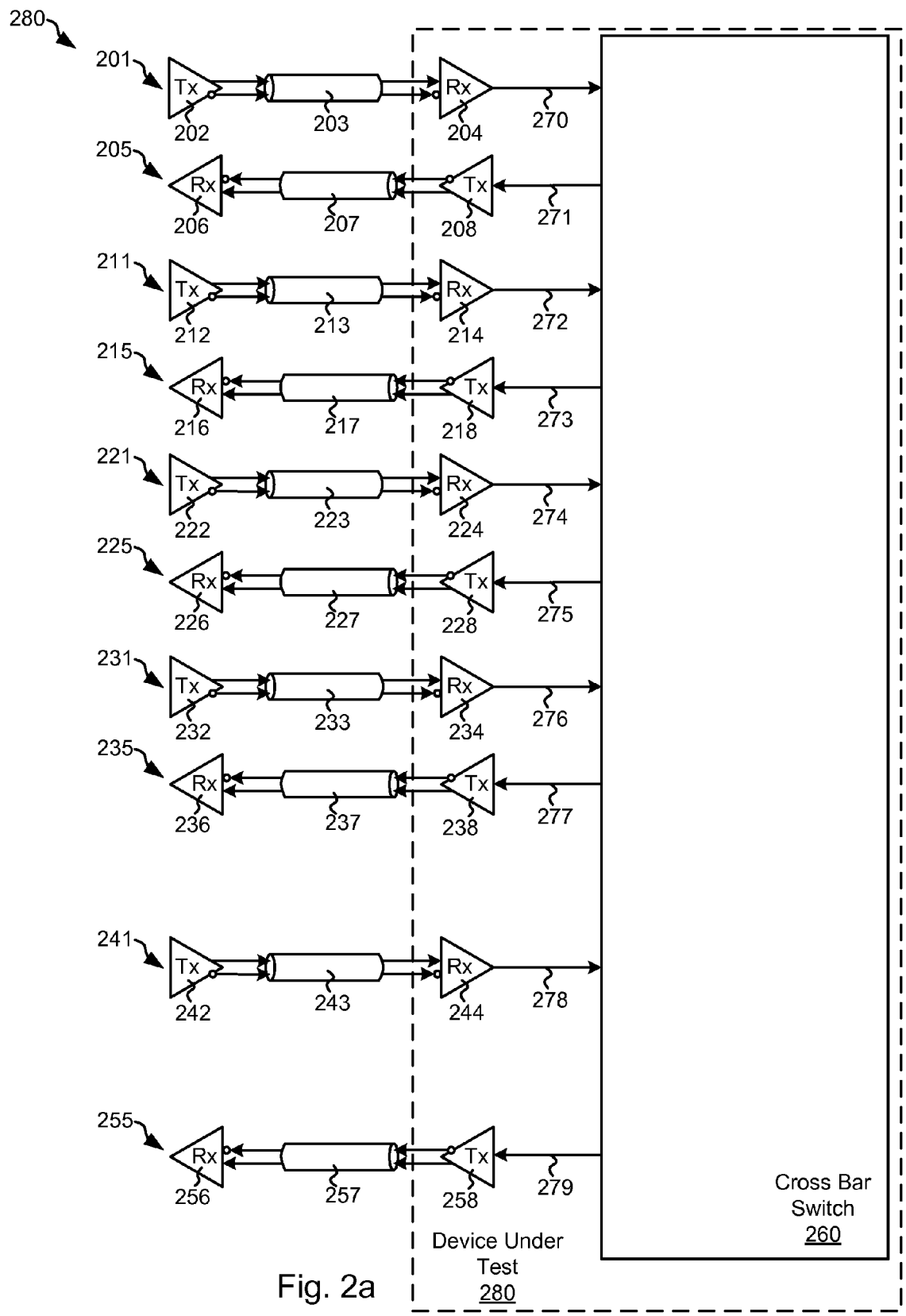
FIGS. 2a-2d show a circuit diagram including a cross bar switch selectively configurable to cross connect transmission and reception circuits to perform identification and mitigation of improper transmission operation in accordance with some embodiments of the present invention.

Turning to FIG. 1a, flow diagram 100 shows a method in accordance with various embodiments of the present invention for identifying and mitigating improper transmission operation. The operation of flow diagram 100 is described in relation to FIGS. 2a-2d and FIG. 3. Turning to FIG. 2a, a circuit diagram 200 shows an example of a device under test 280. Device under test 280 includes a number of transmission circuits 208, 218, 228, 238 and 258; and a number of reception circuits 204, 214, 224, 234 and 244.

Transmission circuit 208 is part of a transmission/reception circuit 205 including a reception circuit 206 connected to transmission circuit 208 via a differential interface 207, and is connected to a cross-bar switch 260 via a connector 271; transmission circuit 218 is part of a transmission/reception circuit 215 including a reception circuit 216 connected to transmission circuit 218 via a differential interface 217, and is connected to cross-bar switch 260 via a connector 273; transmission circuit 228 is part of a transmission/reception circuit 225 including a reception circuit 226 connected to transmission circuit 228 via a differential interface 227, and is connected to cross-bar switch 260 via a connector 275; transmission circuit 238 is part of a transmission/reception circuit 235 including a reception circuit 236 connected to transmission circuit 238 via a differential interface 237, and is connected to cross-bar switch 260 via a connector 277; and transmission circuit 258 is part of a transmission/reception circuit 255 including a reception circuit 256 connected to transmission circuit 258 via a differential interface 257, and is connected to cross-bar switch 260 via a connector 279.

Reception circuit 204 is part of a transmission/reception circuit 201 including a transmission circuit 202 connected to reception circuit 204 via a differential interface 203, and is connected to cross-bar switch 260 via a connector 270; reception circuit 214 is part of a transmission/reception circuit 211 including a transmission circuit 212 connected to reception circuit 214 via a differential interface 213, and is connected to cross-bar switch 260 via a connector 272; reception circuit 224 is part of a transmission/reception circuit 221 including a transmission circuit 222 connected to reception circuit 224 via a differential interface 223, and is connected to cross-bar switch 260 via a connector 274;

reception circuit 234 is part of a transmission/reception circuit 231 including a transmission circuit 232 connected to reception circuit 234 via a differential interface 233, and is connected to cross-bar switch 260 via a connector 276; and reception circuit 244 is part of a transmission/reception circuit 241 including a transmission circuit 242 connected to reception circuit 244 via a differential interface 243, and is connected to cross-bar switch 260 via a connector 278.

Figure 2B:
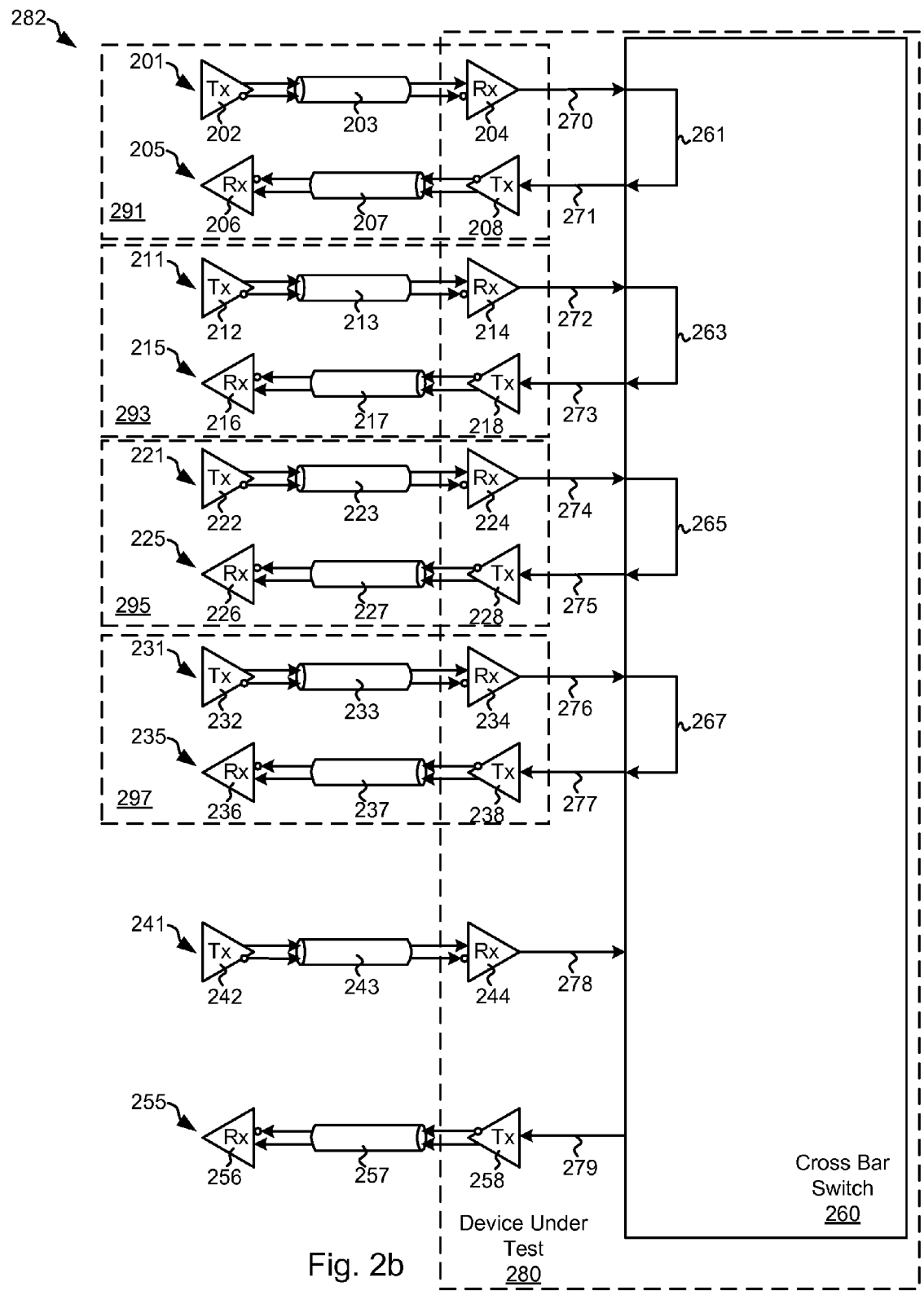

Following flow diagram 100, transmission/reception pairs are set up for a device under test (block 105). Turning to FIG. 2b, cross-bar switch 260 is configured such that: a transmission/reception pair 291 is formed by connecting transmission/reception circuit 201 to transmission/reception circuit 205 via a configured connector 261 such that data transferred from another device via transmission circuit 202 traverses reception circuit 204 and transmission circuit 208 and is returned via reception circuit 206; a transmission/reception pair 293 is formed by connecting transmission/reception circuit 211 to transmission/reception circuit 215 via a configured connector 263 such that data transferred from another device via transmission circuit 212 traverses reception circuit 214 and transmission circuit 218 and is returned via reception circuit 216; a transmission/reception pair 295 is formed by connecting transmission/reception circuit 221 to transmission/reception circuit 225 via a configured connector 265 such that data transferred from another device via transmission circuit 222 traverses reception circuit 224 and transmission circuit 228 and is returned via reception circuit 226; and a transmission/reception pair 297 is formed by connecting transmission/reception circuit 231 to transmission/reception circuit 235 via a configured connector 267 such that data transferred from another device via transmission circuit 232 traverses reception circuit 234 and transmission circuit 238 and is returned via reception circuit 236.

Returning to FIG. 1a, once the transmission/reception pairs are set up (block 105), hard failure testing is performed (block 107). In the discussed embodiment, a low rate far-end-loopback is used to determine hard faults. Such a low rate far-end-loopback involves connecting paths in a cross-bar switch using a resistive connector with a minimum geometry switch or transistor. Based upon the disclosure provided herein, other loopback approaches may be used in relation to different embodiments of the present invention.

Figure 1B:
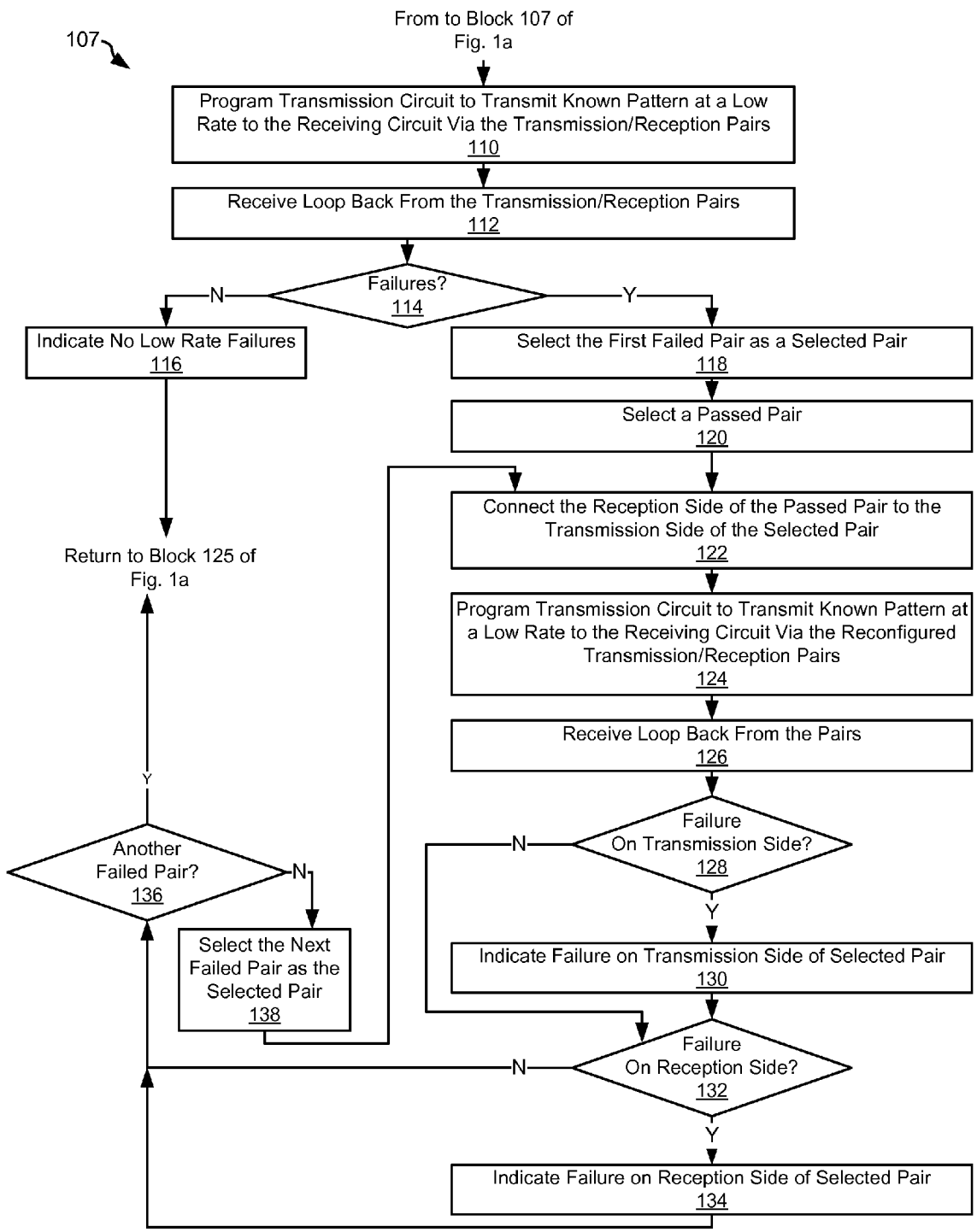

Details of one implementation of the hard failure testing is shown as a flow diagram 107 of FIG. 1b. Turning to FIG. 1b and following flow diagram 107, performing hard failure testing includes programming a transmission circuit to transmit a known pattern at a low rate to a receiving circuit via the configured transmission/reception pairs (block 110). As used herein, the phrase "low rate" is used in its broadest sense to mean a transfer clock rate that is substantially less than a rate at which an interface is expected to operate. For example, a low rate may be one half of an expected transfer rate. Based upon the disclosure provided herein, one of ordinary skill in the art will recognize a variety of rates from ten percent of the expected rate to ninety percent of the expected rate that may be used as the "low rate". This includes providing signals of a known pattern via reception circuits 204, 214, 224, 234 which are looped back via transmission circuits 208, 218, 228, 238. These looped back signals are received from the transmission/reception pairs (block 112). Based upon the loop back data from the transmission/reception pairs (block 112), it is determined whether any of the transmission/reception pairs failed (block 114). This determination may be made by comparing the known pattern that was transmitted against the received loopback data. Where there is a difference between the known pattern and the received loopback data, a failure is indicated. Where no failures are identified (block 114), no low rate failures are indicated (block 116) and the process is returned to block 109 of FIG. 1a.

Figure 2C:
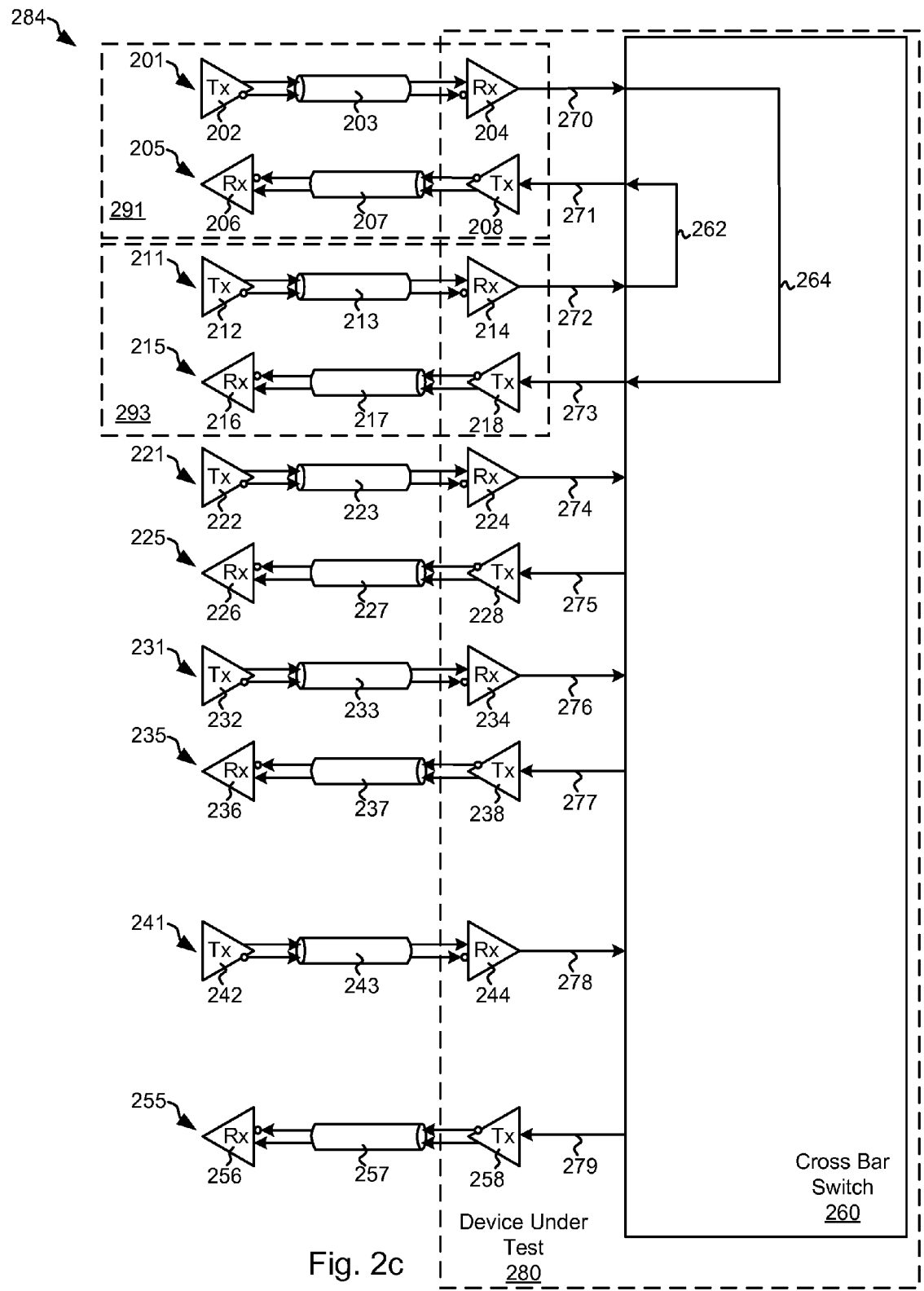
Figure 2D:
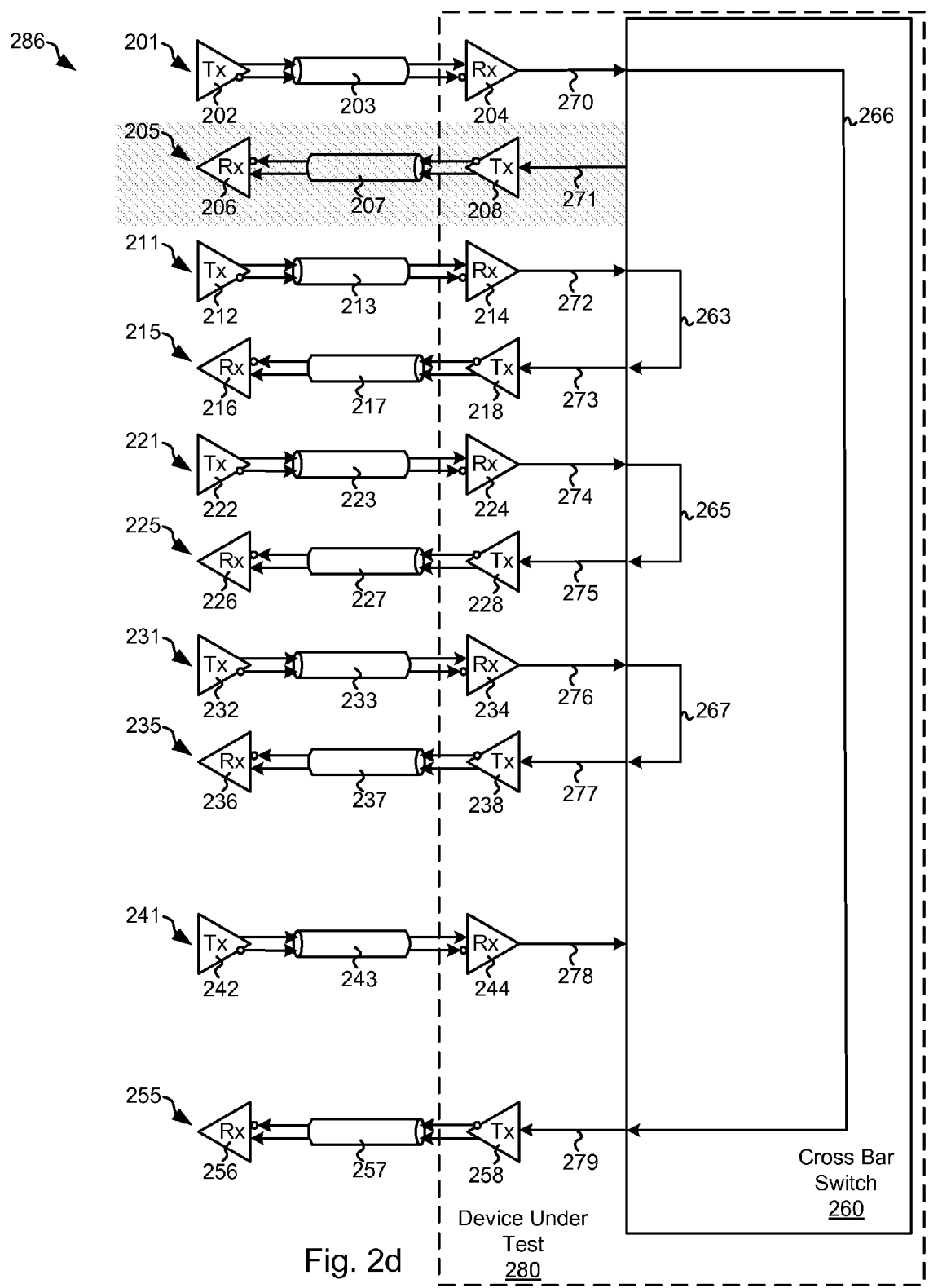

Alternatively, where one or more failures are identified (block 114), the first of the transmission/reception pairs identified as failed is selected as a selected pair (block 118), and any of the other transmission/reception pairs not identified as failed is selected as a passed pair (block 120). Next, the cross-bar switch is configured such that: the reception side of the passed pair is connected to the transmission side of the selected pair (block 122), and the transmission side of the passed pair is connected to the reception side of the selected pair (block 124). Turning to FIG. 2c where, for example, transmission/reception pair 291 was identified as failed and transmission/reception pair 293 was not identified as failed, transmission/reception pair 291 becomes the selected pair and transmission/reception pair 293 becomes the passed pair. As shown, cross-bar switch 260 is configured such that: the reception side (i.e., reception circuit 214) of the passed pair (i.e., transmission/reception pair 293) is connected to the transmission side (i.e., reception circuit 208) of the selected pair (transmission/reception pair 291) by a connector 262; and the transmission side (i.e., reception circuit 218) of the passed pair is connected to the reception side (i.e., reception circuit 204) of the selected pair (transmission/reception pair 291) by a connector 264.

Returning to FIG. 1b, loopback data is received from both transmission/reception pairs that were reconfigured in blocks 122, 124 (block 126). Based upon the loop back data from the transmission/reception pairs (block 126), it is determined whether any of the transmission/reception pairs failed (block 128). Again, this determination may be made by comparing the known pattern that was transmitted against the received loopback data. Where there is a difference between the known pattern and the received loopback data, a failure is indicated. In particular, it is determined whether there is an error on the transmission side (block 128). Using the example of FIG. 2c, an error on the transmission side (i.e., an error in transmission/reception circuit 205) occurs when an error is identified in the transmission from transmission/reception circuit 211 to transmission/reception circuit 205 via connector 262. Where an error is identified on the transmission side (block 128), a failure on the transmission side (i.e., an failure in transmission/reception circuit 205) of the selected pair is identified (block 130).

It is then determined whether there is an error on the reception side (block 132). Using the example of FIG. 2c, an error on the reception side (i.e., an error in transmission/reception circuit 201) occurs when an error is identified in the transmission from transmission/reception circuit 201 to transmission/reception circuit 215 via connector 264. Where an error is identified on the reception side (block 132), a failure on the reception side (i.e., an failure in transmission/reception circuit 201) of the selected pair is identified (block 134).

It is then determined whether another failed pair was identified (block 136). Said another way, it is determined whether any of the transmission/reception pairs that were identified as failed in block 114 remain to be isolated. Where another failed pair remains to be isolated (block 136), the next identified failed transmission/reception pair is selected as the selected pair (block 138) and the processes of blocks 122-136 are repeated for the newly selected transmission/ reception pair. Alternatively, where no additional failed pair remains to be isolated (block 136), the process is returned to block 125 of FIG. 1a.

Returning to FIG. 1a, it is determined whether any hard failures were detected (block 125). Where hard failures were identified (block 107), redundant transmission and/or reception elements are used to correct any hard failures (block 109). Using FIG. 2d as an example where an error in transmission/reception circuit 205, cross-bar switch 260 is configured such that redundant transmission/reception circuit 255 is connected to transmission/reception circuit 205 via a connector 266 an in place of transmission/reception circuit 205. This process of using redundant transmission/reception circuits in place of transmission/reception circuits isolated as having hard failures is done until all hard failures are removed. In the case where an insufficient number of redundant transmission/reception circuits are available to replace all transmission/reception circuits identified as having hard errors, device under test 280 is rejected. At this juncture, the processes of block 107 and block 125 are repeated to test for any additional failures.

Once it is determined that no hard failures remain (block 125), soft failure testing is performed (block 111). Such soft failure testing includes transmitting a known pattern at a high rate through the established transmission/reception pairs. As used herein, the phrase "high rate" is used in its broadest sense to mean a transfer clock rate that is at least ninety percent of the rate at which an interface is expected to operate. In some embodiments, the high rate is the same as the rate at which an interface is expected to operate. The loopback data is compared with the transmitted data using an eye margining based analysis to determine whether any soft failures are occurring. Such eye margining includes automated analysis of the signal eye to determine whether the eye is closing at the high rate. Closing of the signal eye may result in intermittent interface failures which are often difficult to identify, and are referred to herein as a "soft fault". The aforementioned eye margining based analysis may be done using one or more of the circuits and/or methods discussed in: (1) U.S. Pat. No. 8,126,039 entitled "Methods and Apparatus for Evaluating the Eye Margin of a Communications Device Using Data Eye Monitor" by Mobin et al.; (2) U.S. Pat. No. 8,711,906 entitled "Tracking Data Eye Operating Margin for Steady State Adaptation" by Mobin et al.; and/or (3) U.S. Pat. No. 8,300,684 entitled "Real-Time Eye Monitor for Statistical Filter Parameter Calibration" by Mobin et al. The entirety of each of the aforementioned references is incorporated herein by reference for all purposes. Any of the transmission/reception pairs identified by the eye margining processes and/or circuitry as exhibiting a potential soft fault are identified.

Figure 3:
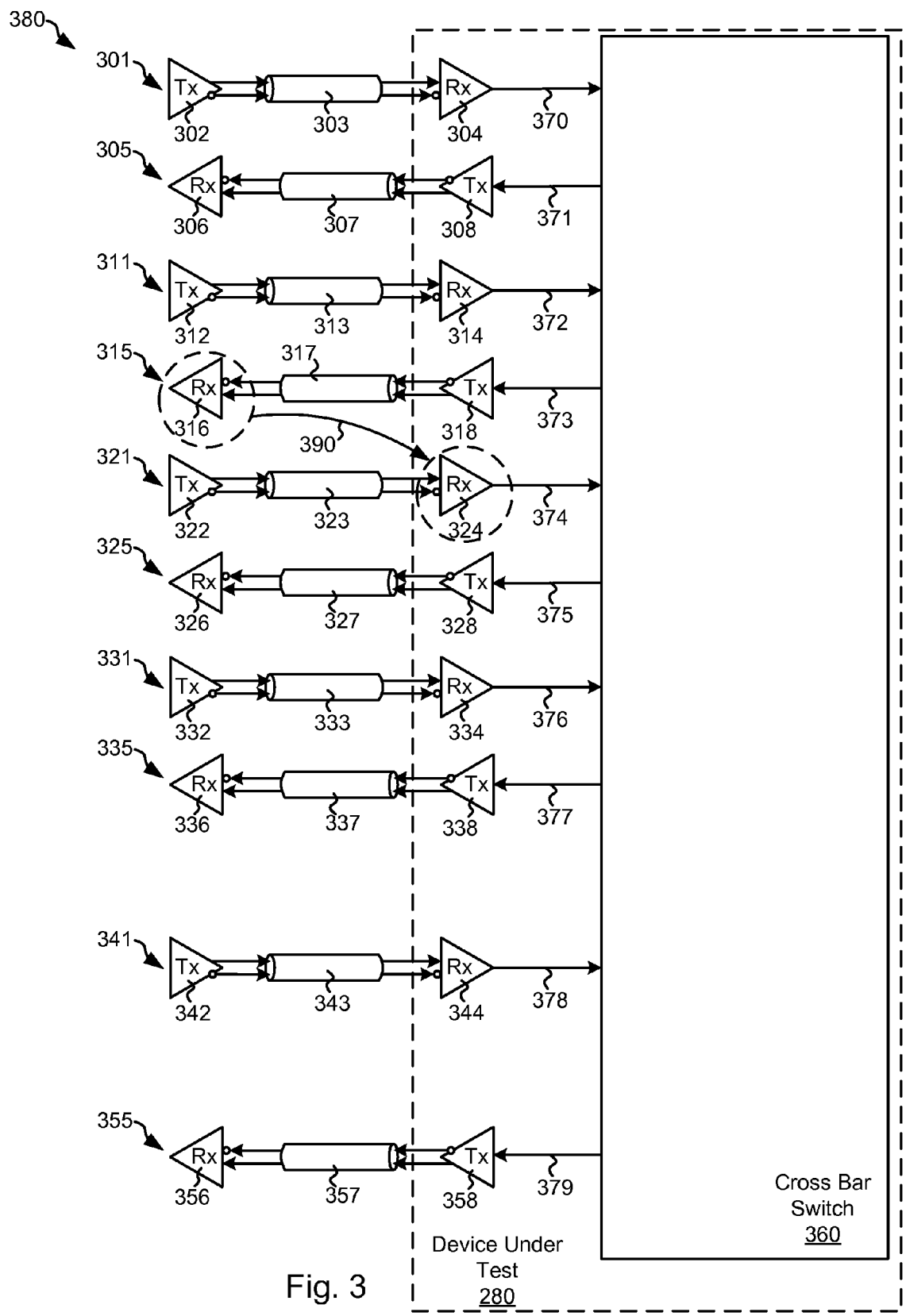
FIG. 3 is a circuit diagram showing a process of cross talk identification and mitigation in accordance with one or more embodiments of the present invention.

As soft faults may be caused or exacerbated by cross talk between transmission/reception circuits, cross talk mitigation is performed for each of the transmission/reception pairs identified as potentially impacted by soft faults (block 113). Details of one implementation of the cross talk mitigation is shown as a flow diagram 113 of FIG. 1c. The operation of flow diagram 113 is described in relation to FIG. 3. Turning to FIG. 3, a circuit diagram 300 shows an example of a device under test 380. Device under test 380 includes a number of transmission circuits 308, 318, 328, 338 and 358; and a number of reception circuits 304, 314, 324, 334 and 344.

Transmission circuit 308 is part of a transmission/reception circuit 305 including a reception circuit 306 connected to transmission circuit 308 via a differential interface 307, and is connected to a cross-bar switch 360 via a connector 371; transmission circuit 318 is part of a transmission/reception circuit 315 including a reception circuit 316 connected to transmission circuit 318 via a differential interface 317, and is connected to cross-bar switch 360 via a connector 373; transmission circuit 328 is part of a transmission/reception circuit 325 including a reception circuit 326 connected to transmission circuit 328 via a differential interface 327, and is connected to cross-bar switch 360 via a connector 375; transmission circuit 338 is part of a transmission/reception circuit 335 including a reception circuit 336 connected to transmission circuit 338 via a differential interface 337, and is connected to cross-bar switch 360 via a connector 377; and transmission circuit 358 is part of a transmission/reception circuit 355 including a reception circuit 356 connected to transmission circuit 358 via a differential interface 357, and is connected to cross-bar switch 360 via a connector 379.

Reception circuit 304 is part of a transmission/reception circuit 301 including a transmission circuit 302 connected to reception circuit 304 via a differential interface 303, and is connected to cross-bar switch 360 via a connector 370; reception circuit 314 is part of a transmission/reception circuit 311 including a transmission circuit 312 connected to reception circuit 314 via a differential interface 313, and is connected to cross-bar switch 360 via a connector 372; reception circuit 324 is part of a transmission/reception circuit 321 including a transmission circuit 322 connected to reception circuit 324 via a differential interface 323, and is connected to cross-bar switch 360 via a connector 374; reception circuit 334 is part of a transmission/reception circuit 331 including a transmission circuit 332 connected to reception circuit 334 via a differential interface 333, and is connected to cross-bar switch 360 via a connector 376; and reception circuit 344 is part of a transmission/reception circuit 341 including a transmission circuit 342 connected to reception circuit 344 via a differential interface 343, and is connected to cross-bar switch 360 via a connector 378.

Figure 1C:
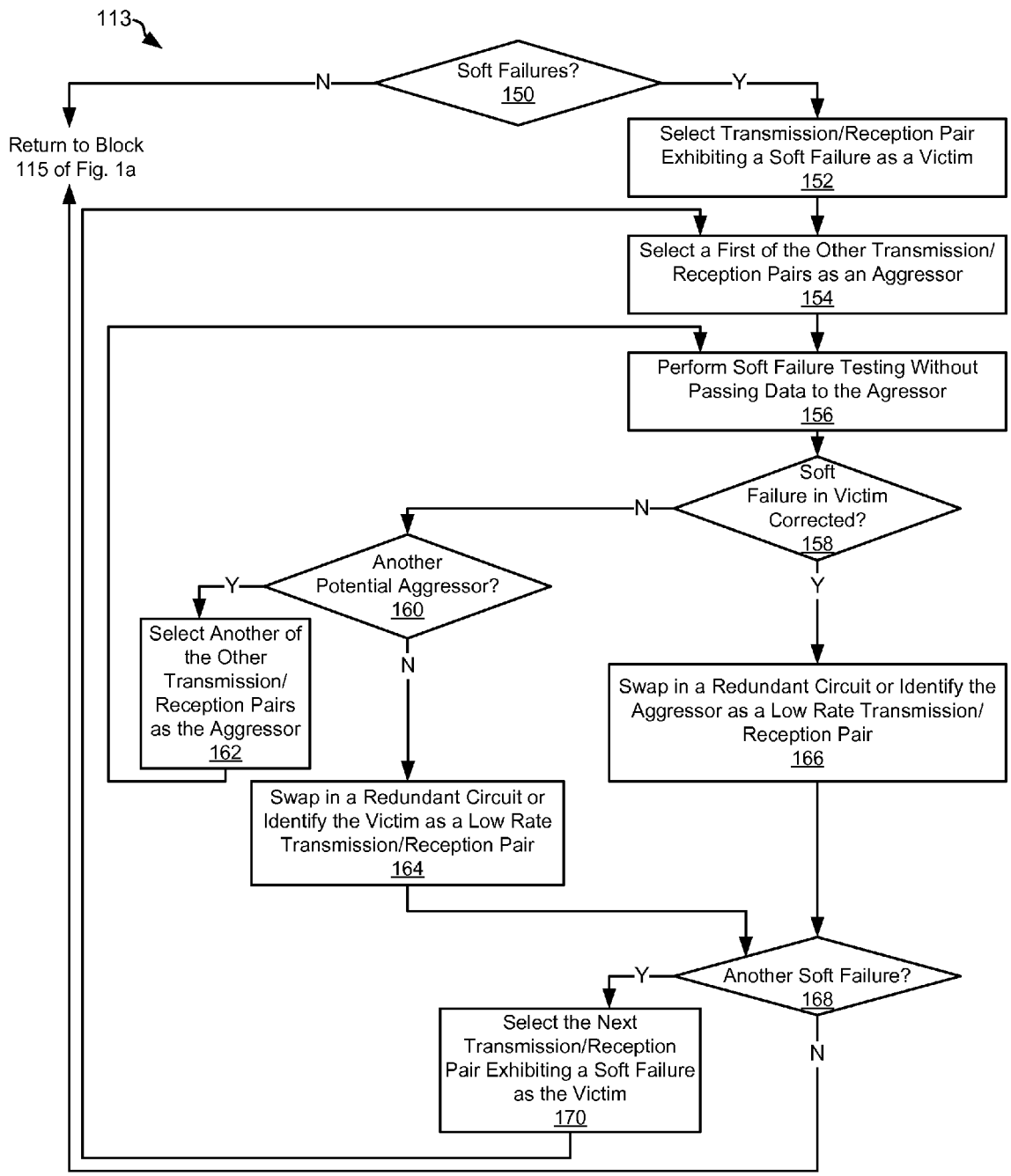

Turning to FIG. 1c and following flow diagram 113, it is determined whether any soft failures were identified in any of the transmission/reception pairs (block 150). Where no soft failures were identified (block 150), the process ends by returning to block 115 of FIG. 1a. Alternatively, where one or more soft failures were identified (block 150), one circuit of the transmission/reception pairs exhibiting a soft failure is identified as a victim (e.g., reception circuit 324) (block 152), and a first circuit of the other transmission/reception pairs is identified as an aggressor (e.g., reception circuit 316) (block 154). The same soft failure testing discussed above in relation to block 111 of FIG. 1a is performed except that no data is transferred via the aggressor (block 156). By doing this, the data being transferred via the aggressor is eliminated or identified as a significant source of the soft failure in the victim.

It is determined whether the soft failure is still evident in the victim when the aggressor is not used (block 158). Where the soft failure is not corrected (block 158), it is determined whether there is another potential aggressor (i.e., another transmission/reception pair other than the victim) that has not yet been tested (block 160). Where there are not any other potential aggressors (block 160), if another redundant circuit exists that can replace the victim it is swapped in (block 164). Otherwise, the victim is identified as a low rate transmission/reception pair (block 164). Alternatively, where another potential aggressor exists (block 160), another of the other transmission/reception pairs (e.g., another of circuits 302, 304, 3096, 308, 312, 314, 318, 326, 328. 332, 334, 336, 338) is selected as the aggressor (block 162) and the processes of blocks 156-158 are repeated for the newly selected aggressor.

Where the soft failure in the victim is corrected (block 158), if another redundant circuit exists (e.g., one of transmission/reception circuit 341, 355) that can replace the aggressor it is swapped in (block 166). Otherwise, the aggressor is identified as a low rate transmission/reception pair (block 166). It is then determined whether any more transmission/reception pairs were identified as exhibiting soft failures (block 168). Where another exists (block 168), the next transmission/reception pair exhibiting a soft failure is selected as the victim (block 170) and the processes of blocks 154-168 are repeated for the newly selected victim. Otherwise, where no other potential victims remain to be mitigated (block 168), the process ends by returning to block 115 of FIG. 1a.

Returning to FIG. 1a, any transmission/reception pair identified as a low rate pair are group together in a low rate interface (block 115), and all other transmission/reception pairs are grouped together as a high rate interface (block 117). It is then determined if there are enough transmission/reception pairs in the high rate interface to satisfy the particular application of the device under test (block 119). Where enough transmission/reception pairs exist in the high rate interface (block 119), a device pass is indicated (block 123). Otherwise, the device is failed and is rejected (block 121).

Figure 4:
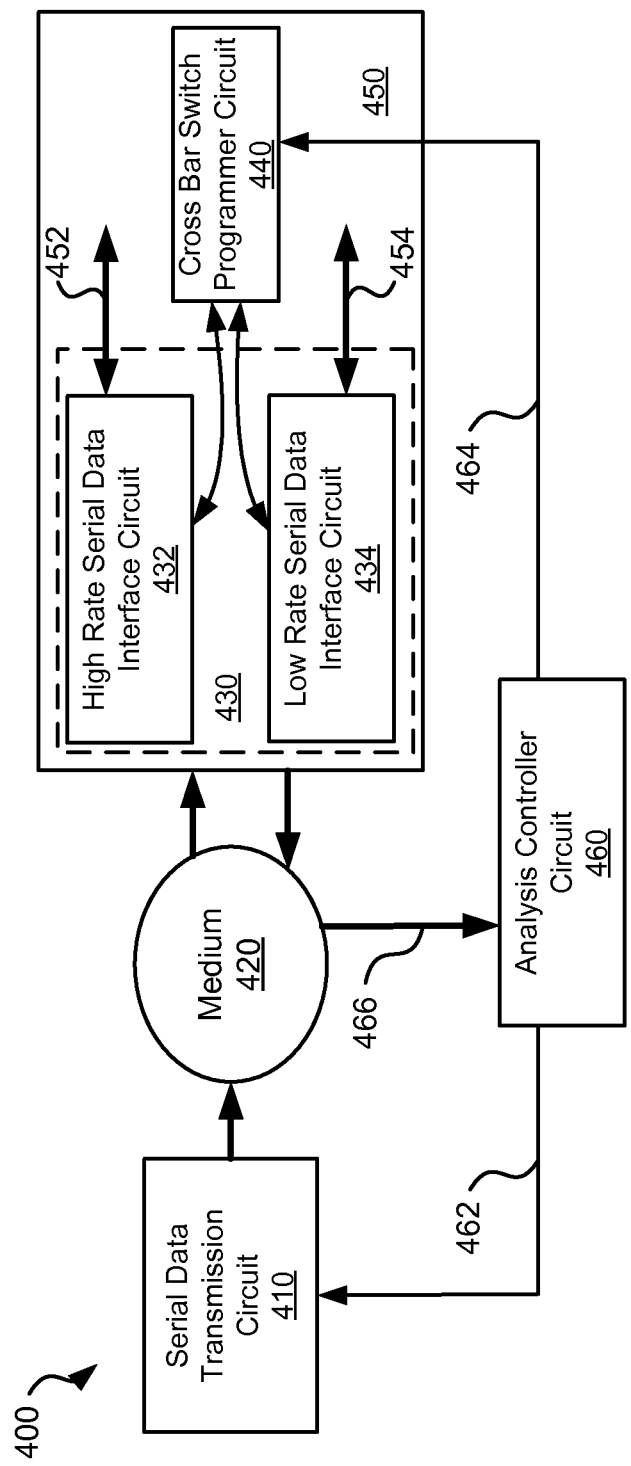
FIG. 4 is a serial data transfer system including a serial data transmitter, a device under test, and an analysis controller circuit in accordance with various embodiments of the present invention.

Turning to FIG. 4, a serial data transfer system 400 including a serial data transmitter 410, a device under test 450, and an analysis controller circuit 460 is shown in accordance with various embodiments of the present invention. Analysis controller circuit 460 is configured to qualify and/or mitigate the operation of device under test 450 using data transmitted from serial data transmitter 410 via a medium 420. In some embodiments, medium 420 is a differentially wired interface. Based upon the disclosure provided herein, one of ordinary skill in the art will recognize a variety of media that may be used to implement medium 420 in accordance with different embodiments of the present invention. It should be noted that while serial data transmitter 410 and analysis controller circuit 460 are shown as separate circuits, in other embodiments serial data transmitter 410 and analysis controller circuit 460 may be implemented as the same circuit.

Medium 420 may be implemented similar to that shown in FIG. 2a and including a number of differential interfaces 203, 207, 213, 217, 223, 227, 233, 237, 243, 257. Analysis controller circuit 460 includes a number of reception circuits similar to reception circuits 206, 216, 226, 236 and 246 of FIG. 2a. Serial data transmitter 410 includes a number of transmission circuits similar to transmission circuits 201, 211, 221, 231 and 251 of FIG. 2a.

Device under test 450 includes a transmission/reception system 430 (shown as a dashed line) that may be divided and grouped into a high rate serial data interface circuit 432 supporting a high rate internal interface 452 and a low rate serial data interface circuit 434 supporting a high rate internal interface 452. The grouping of transmission/reception circuits of transmission/reception system 430 into high rate serial data interface circuit 432 low rate serial data interface circuit 434 is controlled by a cross bar switch (included in transmission/reception system 430) and controlled by a cross bar switch programmer circuit 440. The transmission circuits of transmission/reception system 430 may be implemented similar to transmission circuits 208, 218, 228, 238 and 258 of device under test 280 of FIG. 2a; the reception circuits of transmission/reception system 430 may be implemented similar to reception circuits 204, 214, 224, 234 and 244 of device under test 280 of FIG. 2a; and the cross bar switch included in transmission/reception system 430 may be implemented similar to cross bar switch 260 of FIG. 2a.

In operation, analysis controller circuit 460 provides a command via a control interface 464 to cross bar switch programmer circuit 464. Cross bar switch programmer circuit 464 executes the command by causing the cross bar switch of transmission/reception system 430 to set up transmission/reception pairs out of the transmission circuits and reception circuits in transmission/reception system 430. Using the implementation of FIG. 2b as an example, setting up the transmission/reception pairs results in: transmission/reception pair 291 formed by connecting transmission/reception circuit 201 to transmission/reception circuit 205 via configured connector 261 such that data transferred from serial data transmission circuit 410 via medium 420 traverses reception circuit 204 and transmission circuit 208 and is returned via medium 420 and reception circuit 206 to analysis controller circuit 460; transmission/reception pair 293 formed by connecting transmission/reception circuit 211 to transmission/reception circuit 215 via configured connector 263 such that data transferred from serial data transmission circuit 410 via medium 420 traverses reception circuit 214 and transmission circuit 218 and is returned via medium 420 and reception circuit 216 to analysis controller circuit 460; transmission/reception pair 295 formed by connecting transmission/reception circuit 221 to transmission/reception circuit 225 via configured connector 265 such that data transferred from serial data transmission circuit 410 via medium 420 traverses reception circuit 224 and transmission circuit 228 and is returned via medium 420 and reception circuit 226 to analysis controller circuit 460; and transmission/reception pair 297 formed by connecting transmission/reception circuit 231 to transmission/reception circuit 235 via configured connector 267 such that data transferred from serial data transmission circuit 410 via medium 420 traverses reception circuit 234 and transmission circuit 238 and is returned via medium 420 and reception circuit 236 to analysis controller circuit 460.

Once the transmission/reception pairs are set up by analysis controller circuit 460 and cross bar switch programmer circuit 464, analysis controller circuit 460 provides a command via a control interface 462 to serial data transmission circuit 410 causing serial data transmission circuit 410 to transmit a known data pattern via transmission circuits 201, 211, 221, 231 and 251 at a low rate to device under test 450. Because of the loop back connection in the transmission/reception pairs, the known pattern is transmitted as loop back to analysis controller circuit 460 via reception circuits 206, 216, 226, 236 and 246.

Analysis controller circuit 460 uses the loop back data to perform hard failure testing. Such hard failure testing includes using a comparator circuit (not shown) to compare the loop back data with the known pattern to determine whether there is a difference between the known pattern and the received loopback data. Where analysis controller circuit 460 identifies a difference between the known pattern and the loop back data, a preliminary hard failure of the corresponding transmission/reception pair is indicated. Otherwise, where no differences between the known pattern and the loop back data, no preliminary hard failures are indicated.

Where one or more preliminary hard failures are identified, analysis controller circuit 460 issues a command via control interface 464 to connect the first of the transmission/reception pairs identified as failed (i.e., a failed pair) with any of the other transmission/reception pairs not identified as failed (i.e., a passed pair) such that the reception side of the passed pair is connected to the transmission side of the failed pair, and the transmission side of the passed pair is connected to the reception side of the failed pair. This command is executed by cross bar switch programmer circuit 440. Using the example of FIG. 2, execution of the command results in the configuration shown in FIG. 2c where transmission/reception pair 291 was identified as failed and transmission/reception pair 293 was not identified as failed, transmission/reception pair 291 becomes the failed pair and transmission/reception pair 293 becomes the passed pair. As shown, cross-bar switch 260 is configured such that: the reception side (i.e., reception circuit 214) of the passed pair (i.e., transmission/reception pair 293) is connected to the transmission side (i.e., reception circuit 208) of the selected pair (transmission/reception pair 291) by a connector 262; and the transmission side (i.e., reception circuit 218) of the passed pair is connected to the reception side (i.e., reception circuit 204) of the selected pair (transmission/reception pair 291) by a connector 264.

Once this reconfiguration is done, loopback data is received by analysis controller circuit 460 from both transmission/reception pairs that were reconfigured. Based upon the loop back data from the transmission/reception pairs, analysis controller circuit 460 determines whether either of the newly reconfigured transmission/reception pairs failed. Again, this determination may be made by comparing the known pattern that was transmitted against the received loopback data. Where there is a difference between the known pattern and the received loopback data, a failure is indicated. In particular, it is determined whether there is an error on the transmission side. Using the example of FIG. 2c, an error on the transmission side (i.e., an error in transmission/reception circuit 205) occurs when an error is identified in the transmission from transmission/reception circuit 211 to transmission/reception circuit 205 via connector 262. Where an error is identified on the transmission side, analysis controller circuit 460 indicates the identified failure on the transmission side (i.e., an failure in transmission/reception circuit 205) of the earlier identified failed pair. Analysis controller circuit 460 also determines whether there is an error on the reception side. Using the example of FIG. 2c, an error on the reception side (i.e., an error in transmission/reception circuit 201) occurs when an error is identified in the transmission from transmission/reception circuit 201 to transmission/reception circuit 215 via connector 264. Where an error is identified on the reception side, analysis controller circuit 460 indicates the identified failure on the reception side (i.e., an failure in transmission/reception circuit 201) of the earlier identified failed pair. Analysis controller circuit 460 repeats this process for each of the earlier identified failed transmission/reception pairs until the failure is identified as either or both of a reception side failure and/or a transmission side failure.

The aforementioned isolated failures are indicated as hard failures. Analysis controller circuit 460 sends a command via control interface 464 to replace the circuits exhibiting a hard failure with respective ones of a number of redundant transmission and/or reception elements included in transmission/reception system 430. Using FIG. 2d as an example where an error in transmission/reception circuit 205, cross-bar switch 260 is configured such that redundant transmission/reception circuit 255 is connected to transmission/reception circuit 205 via a connector 266 an in place of transmission/reception circuit 205. This process of using redundant transmission/reception circuits in place of transmission/reception circuits isolated as having hard failures is done until all hard failures are removed. In the case where an insufficient number of redundant transmission/reception circuits are available to replace all transmission/reception circuits identified as having hard errors, device under test 280 is rejected. With the reconfiguration complete, analysis controller circuit 460 causes a repeat of the hard failure testing to assure that the reconfiguration including the redundant circuit(s) operates properly at the low rate.

Once it is determined that no hard failures remain, analysis controller circuit 460 causes soft failure testing to be performed. Such soft failure testing includes transmitting a known pattern at a high rate through the established transmission/reception pairs. Analysis controller circuit 460 compares the loopback data generated based upon the high rate known pattern with the known pattern using an eye margining based analysis to determine whether any soft failures are occurring. Such eye margining includes automated analysis of the signal eye to determine whether the eye is closing at the high rate. Closing of the signal eye may result in intermittent interface failures which are often difficult to identify, and are referred to herein as a "soft fault". The aforementioned eye margining based analysis may be done using one or more of the circuits and/or methods discussed in: (1) U.S. Pat. No. 8,126,039 entitled "Methods and Apparatus for Evaluating the Eye Margin of a Communications Device Using Data Eye Monitor" by Mobin et al.; (2) U.S. Pat. No. 8,711,906 entitled "Tracking Data Eye Operating Margin for Steady State Adaptation" by Mobin et al.; and/or (3) U.S. Pat. No. 8,300,684 entitled "Real-Time Eye Monitor for Statistical Filter Parameter Calibration" by Mobin et al.

As soft faults may be caused or exacerbated by cross talk between transmission/reception circuits, analysis controller circuit 460 causes cross-talk mitigation to be performed for each of the transmission/reception pairs identified as potentially impacted by soft faults. Analysis controller circuit 460 determines whether any soft failures were identified in any of the transmission/reception pairs. Where no soft failures were identified, analysis controller circuit 460 indicates that device under test 450 passed. Alternatively, where analysis controller circuit 460 identified one or more soft failures, one circuit of the transmission/reception pairs exhibiting a soft failure is identified as a victim (e.g., reception circuit 324), and a first circuit of the other transmission/reception pairs is identified as an aggressor (e.g., reception circuit 316). The same soft failure testing previously performed to identify the soft failure now being mitigated is re-performed under direction of analysis controller circuit 460 except that analysis controller circuit 460 commands serial data transmitter 410 not to transmit data to the aggressor. By doing this, the data being transferred via the aggressor is eliminated or identified as a significant source of the soft failure in the victim.

Analysis controller circuit 460 determines whether the soft failure is still evident in the victim when the aggressor is not used. Where the soft failure is not corrected, analysis controller circuit 460 selects another potential aggressor (i.e., another transmission/reception pair other than the victim) that has not yet been tested, and causes the soft failure testing to be performed again. Once all potential aggressors have been tested without successful mitigation of the soft fault, analysis controller circuit 460 replaces the circuit exhibiting the soft fault with one of the redundant circuits included in transmission/reception system 430 where another redundant circuit is available. Where a swap occurs, the soft fault testing is re-performed using the redundant circuit. Alternatively, where no redundant circuits remain, analysis controller circuit 460 identifies the circuit exhibiting the soft fault as a low rate transmission/reception pair.

Alternatively, where another potential aggressor exists, another of the other transmission/reception pairs (e.g., another of circuits 302, 304, 3096, 308, 312, 314, 318, 326, 328. 332, 334, 336, 338) is selected by analysis controller circuit 460 as the aggressor and the process of soft fault detection is re-performed with the newly selected aggressor turned off to see if it corrects the soft fault. Where the soft failure in the victim is corrected, analysis controller circuit 460 replaces the selected aggressor circuit associated with the soft fault with one of the redundant circuits included in transmission/reception system 430 where another redundant circuit is available. Where a swap occurs, the soft fault testing is re-performed using the redundant circuit. Alternatively, where no redundant circuits remain, analysis controller circuit 460 identifies the selected aggressor circuit associated with the soft fault as a low rate transmission/reception pair. Analysis controller circuit 460 repeats the aforementioned soft fault mitigation until all of the soft faults have either been corrected or circuits have been identified as part of a low rate transmission/reception pair.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent, albeit such a system would not be a circuit. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for device validation, the method comprising:
   providing a device under test, wherein the device under test includes at least a first transmission circuit, a second transmission circuit, a first reception circuit, a second reception circuit, and a cross bar switch electrically connected to each of the first transmission circuit, the second transmission circuit, the first reception circuit, and the second reception circuit;
   programming the cross bar switch such that: the first transmission circuit is communicably coupled to the first reception circuit, and the second transmission circuit is communicably coupled to the second reception circuit;
   performing a hard fault test by passing a known pattern to the first reception circuit and the second reception circuit, wherein a first hard fault is identified in at least one of the first reception circuit or the first transmission circuit;
   programming the cross bar switch such that: the first transmission circuit is communicably coupled to the second reception circuit, and the second transmission circuit is communicably coupled to the first reception circuit; and
   re-performing the hard fault test by passing the known pattern to the first reception circuit and the second reception circuit, wherein a second hard fault is identified which isolates at least one of the first reception circuit or the first transmission circuit as the cause of the first hard fault.

2. The method of claim 1, wherein the second hard fault isolates the first reception circuit as the cause of the first hard fault, and wherein the device under test further includes a redundant reception circuit, the method further comprising:
   programming the cross bar switch such that the redundant reception circuit replaces the first reception circuit.

3. The method of claim 1, wherein the second hard fault isolates the first transmission circuit as the cause of the first hard fault, and wherein the device under test further includes a redundant transmission circuit, the method further comprising:
   programming the cross bar switch such that the redundant transmission circuit replaces the first transmission circuit.

4. The method of claim 1, wherein passing the known pattern to the first reception circuit and the second reception circuit is done at a low rate.

5. The method of claim 1, wherein the device under test further includes a third transmission circuit and a third reception circuit electrically coupled via the cross bar switch, the method further comprising:
   performing a soft fault test by passing the known pattern to the first reception circuit, the second reception circuit, and the third reception circuit, wherein a soft fault is identified in at least one of the first reception circuit or the first transmission circuit; and
   re-performing the soft fault test by passing the known pattern to the first reception circuit and the third reception circuit, but not to the second reception circuit.

6. The method of claim 5, wherein the device under test further includes a redundant reception circuit and a redundant transmission circuit, and wherein re-performing the soft fault test results in identifying a soft fault in at least one of the first reception circuit or the first transmission circuit, the method further comprising:
   programming the cross bar switch such that at least one of the redundant reception circuit or the redundant transmission circuit replaces a corresponding one of the first reception circuit or the first redundant transmission circuit.

7. The method of claim 5, wherein re-performing the soft fault test results in identifying a soft fault in at least one of the first reception circuit or the first transmission circuit, the method further comprising:
   grouping at least one of the first reception circuit or the first redundant transmission circuit in a low rate interface.

8. The method of claim 5, wherein the device under test further includes a redundant reception circuit and a redundant transmission circuit, and wherein re-performing the soft fault test results in elimination of the soft fault in the at least one of the first reception circuit or the first transmission circuit, the method further comprising:
programming the cross bar switch such that a corresponding one of the redundant reception circuit or the redundant transmission circuit replaces the aggressor circuit.

9. The method of claim 5, wherein re-performing the soft fault test results in elimination of the soft fault in the at least one of the first reception circuit or the first transmission circuit, the method further comprising:
grouping the aggressor circuit in a low rate interface.

10. The method of claim 5, wherein passing the known pattern to the first reception circuit and the second reception circuit during the soft fault test is done at a high rate.

11. A method for device validation, the method comprising:
providing a device under test, wherein the device under test includes at least a first transmission circuit, a second transmission circuit, a third transmission circuit, a first reception circuit, a second reception circuit, a third reception circuit, and a cross bar switch electrically connected to each of the first transmission circuit, the second transmission circuit, the first reception circuit, and the second reception circuit;
performing a soft fault test by passing the known pattern to the first reception circuit, the second reception circuit, and the third reception circuit, wherein a soft fault is identified in at least one of the first reception circuit or the first transmission circuit; and
re-performing the soft fault test by passing the known pattern to the first reception circuit and the third reception circuit, but not to the second reception circuit.

12. The method of claim 11, the method further comprising:
programming the cross bar switch such that: the first transmission circuit is communicably coupled to the first reception circuit, the second transmission circuit is communicably coupled to the second reception circuit, and the third transmission circuit is communicably coupled to the third reception circuit;
performing a hard fault test by passing a known pattern to the first reception circuit, the second reception circuit, and the third reception circuit, wherein a first hard fault is identified in at least one of the first reception circuit or the first transmission circuit;
programming the cross bar switch such that: the first transmission circuit is communicably coupled to the second reception circuit, and the second transmission circuit is communicably coupled to the first reception circuit; and
re-performing the hard fault test by passing the known pattern to the first reception circuit and the second reception circuit, wherein a second hard fault is identified which isolates at least one of the first reception circuit or the first transmission circuit as the cause of the first hard fault.

13. The method of claim 11, wherein the device under test further includes a redundant reception circuit and a redundant transmission circuit, and wherein re-performing the soft fault test results in identifying a soft fault in at least one of the first reception circuit or the first transmission circuit, the method further comprising:
programming the cross bar switch such that at least one of the redundant reception circuit or the redundant transmission circuit replaces a corresponding one of the first reception circuit or the first redundant transmission circuit.

14. The method of claim 11, wherein re-performing the soft fault test results in identifying a soft fault in at least one of the first reception circuit or the first transmission circuit, the method further comprising:
grouping at least one of the first reception circuit or the first redundant transmission circuit in a low rate interface.

15. The method of claim 11, wherein the device under test further includes a redundant reception circuit and a redundant transmission circuit, and wherein re-performing the soft fault test results in elimination of the soft fault in the at least one of the first reception circuit or the first transmission circuit, the method further comprising:
programming the cross bar switch such that a corresponding one of the redundant reception circuit or the redundant transmission circuit replaces the aggressor circuit.

16. The method of claim 11, re-performing the soft fault test results in elimination of the soft fault in the at least one of the first reception circuit or the first transmission circuit, the method further comprising:
grouping the aggressor circuit in a low rate interface.

17. The method of claim 11, wherein passing the known pattern to the first reception circuit and the second reception circuit during the soft fault test is done at a high rate.

18. A test system, the test system comprising:
a serial data transfer circuit; and
an analysis control circuit, wherein the analysis control circuit is configured to:
provide a command to a device under test, wherein the device under test includes at least a first transmission circuit, a second transmission circuit, a first reception circuit, a second reception circuit, and a cross bar switch electrically connected to each of the first transmission circuit, the second transmission circuit, the first reception circuit, and the second reception circuit, and wherein the command causes the cross bar switch to be programmed such that: the first transmission circuit is communicably coupled to the first reception circuit, and the second transmission circuit is communicably coupled to the second reception circuit;
send a command to the serial data transfer circuit to pass a known pattern to the first reception circuit and the second reception circuit;
receive loop back data from via the first transmission circuit and the second transmission circuit;
detect a first hard fault in at least one of the first reception circuit or the first transmission circuit;
send a command to the device under test to program the cross bar switch such that: the first transmission circuit is communicably coupled to the second reception circuit, and the second transmission circuit is communicably coupled to the first reception circuit;
receive loop back data from via the first transmission circuit and the second transmission circuit; and
detect a second hard fault, wherein the second hard fault isolates at least one of the first reception circuit or the first transmission circuit as the cause of the first hard fault.

19. The system of claim 18, wherein the device under test further includes a third transmission circuit and a third reception circuit electrically coupled via the cross bar switch, and wherein the analysis control circuit is further operable to:
send a command to the serial data transfer circuit to pass the known pattern to the first reception circuit, the second reception circuit, and the third reception circuit;

receive loop back data from via the first transmission circuit, the second transmission circuit, and the third transmission circuit;
detect a first soft fault in at least one of the first reception circuit or the first transmission circuit;
send a command to the serial data transfer circuit to pass the known pattern to the first reception circuit, the second reception circuit, but not the third reception circuit; and
detect a second soft fault in at least one of the first reception circuit or the first transmission circuit, wherein at least one of the third reception circuit or the third transmission circuit is identified as a cause of the first soft fault.

20. The system of claim 18, wherein the device under test further includes a third transmission circuit and a third reception circuit electrically coupled via the cross bar switch, and wherein the analysis control circuit is further operable to:

send a command to the serial data transfer circuit to pass the known pattern to the first reception circuit, the second reception circuit, and the third reception circuit;
receive loop back data from via the first transmission circuit, the second transmission circuit, and the third transmission circuit;
detect a soft fault in at least one of the first reception circuit or the first transmission circuit;
send a command to the serial data transfer circuit to pass the known pattern to the first reception circuit, the second reception circuit, but not the third reception circuit; and
wherein no soft fault is detected the at least one of the first reception circuit or the first transmission circuit, wherein at least one of the third reception circuit or the third transmission circuit is identified as having no causal relationship to the soft fault.

* * * * *